United States Patent
Sarraj

(10) Patent No.: US 11,611,351 B2
(45) Date of Patent: *Mar. 21, 2023

(54) DIFFERENTIAL CONVERTER WITH OFFSET CANCELATION

(71) Applicant: TEXAS INSTRUMENTS INCORPORATED, Dallas, TX (US)

(72) Inventor: Maher Mahmoud Sarraj, Plano, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 17/483,082

(22) Filed: Sep. 23, 2021

(65) Prior Publication Data

US 2022/0131550 A1    Apr. 28, 2022

Related U.S. Application Data

(63) Continuation of application No. 17/077,439, filed on Oct. 22, 2020, now Pat. No. 11,159,170.

(51) Int. Cl.
*H03M 1/12* (2006.01)
*H04B 1/16* (2006.01)
*H03M 1/38* (2006.01)
*H03M 1/18* (2006.01)

(52) U.S. Cl.
CPC ......... *H03M 1/1245* (2013.01); *H03M 1/181* (2013.01); *H03M 1/38* (2013.01); *H04B 1/16* (2013.01)

(58) Field of Classification Search
CPC ....... H03M 1/1245; H03M 1/181; H03M 1/38
See application file for complete search history.

(56) References Cited

U.S. PATENT DOCUMENTS

| | | | |
|---|---|---|---|
| 5,831,562 A | 11/1998 | Van Auken et al. | |
| 7,136,430 B2 | 11/2006 | Morris et al. | |
| 7,215,159 B2 | 5/2007 | Shimizu et al. | |
| 7,313,380 B2 | 12/2007 | Yamaji | |
| 8,149,020 B2 | 4/2012 | Ishii | |
| 8,352,837 B1* | 1/2013 | Zhu | G06F 11/10 |
| | | | 714/776 |
| 8,513,982 B1 | 8/2013 | Garrity et al. | |
| 11,051,153 B1* | 6/2021 | Aljohani | H03M 13/6306 |
| 11,159,170 B1* | 10/2021 | Sarraj | H04B 1/16 |
| 11,211,904 B1* | 12/2021 | Gupta | H03F 3/45475 |
| 2007/0266300 A1* | 11/2007 | Ito | H03M 13/293 |
| | | | 714/770 |
| 2009/0201051 A1 | 8/2009 | Ono et al. | |

(Continued)

OTHER PUBLICATIONS

"Sample-and-Hold Amplifiers", MT-090 Tutorial, Analog Devices, Inc, 2009, pp. 1-21.

(Continued)

*Primary Examiner* — Lam T Mai
(74) *Attorney, Agent, or Firm* — Brian D. Graham; Frank D. Cimino

(57) ABSTRACT

In described examples, a sample and hold circuit is configured to periodically connect one input of an op-amp to a reference voltage through a switch while a second input of the op-amp is connected to an output of the op-amp. Offset cancellation is performed by storing a sampled offset on a sampling capacitor coupled to the second input of the op-amp.

20 Claims, 6 Drawing Sheets

(56) References Cited

U.S. PATENT DOCUMENTS

| | | | |
|---|---|---|---|
| 2010/0141822 A1* | 6/2010 | Xue | H04N 5/378 370/537 |
| 2011/0133895 A1 | 6/2011 | Wu et al. | |
| 2012/0086499 A1* | 4/2012 | Husain | H03K 17/145 327/434 |
| 2013/0107611 A1* | 5/2013 | Cai | G11C 11/1673 365/158 |
| 2018/0041229 A1* | 2/2018 | Yazdi | H03M 13/19 |
| 2020/0234636 A1* | 7/2020 | Lin | H03K 3/356113 |
| 2021/0279584 A1* | 9/2021 | Xu | G06F 17/16 |
| 2022/0209783 A1* | 6/2022 | Wu | G11C 27/026 |

OTHER PUBLICATIONS

PCT International Search Report; PCT/US 2021/055942; dated Jan. 27, 2022; 2 pages.

* cited by examiner

DIFFERENTIAL CONVERTER WITH OFFSET CANCELATION

CROSS-REFERENCE TO RELATED APPLICATIONS

This application claims the benefit of and priority to U.S. patent application Ser. No. 17/077,439, filed on Oct. 22, 2020, which is hereby incorporated by reference.

TECHNICAL FIELD

This relates to a differential converter that has an offset cancellation circuit.

BACKGROUND

In electronics, a sample and hold circuit is an analog device that samples the voltage of a continuously varying analog signal and holds its value at a constant level for a specified minimum period of time. Sample and hold circuits and related peak detectors are the elementary analog memory devices. They are typically used in analog-to-digital converters (ADC) to eliminate variations in input signal that can corrupt the conversion process.

SUMMARY

In described examples, a sample and hold circuit is configured to periodically connect one input of an op-amp to a reference voltage through a switch while a second input of the op-amp is connected to an output of the op-amp. Offset cancellation is performed by storing a sampled offset on a sampling capacitor coupled to the second input of the op-amp.

DETAILED DESCRIPTION

Figure 1:
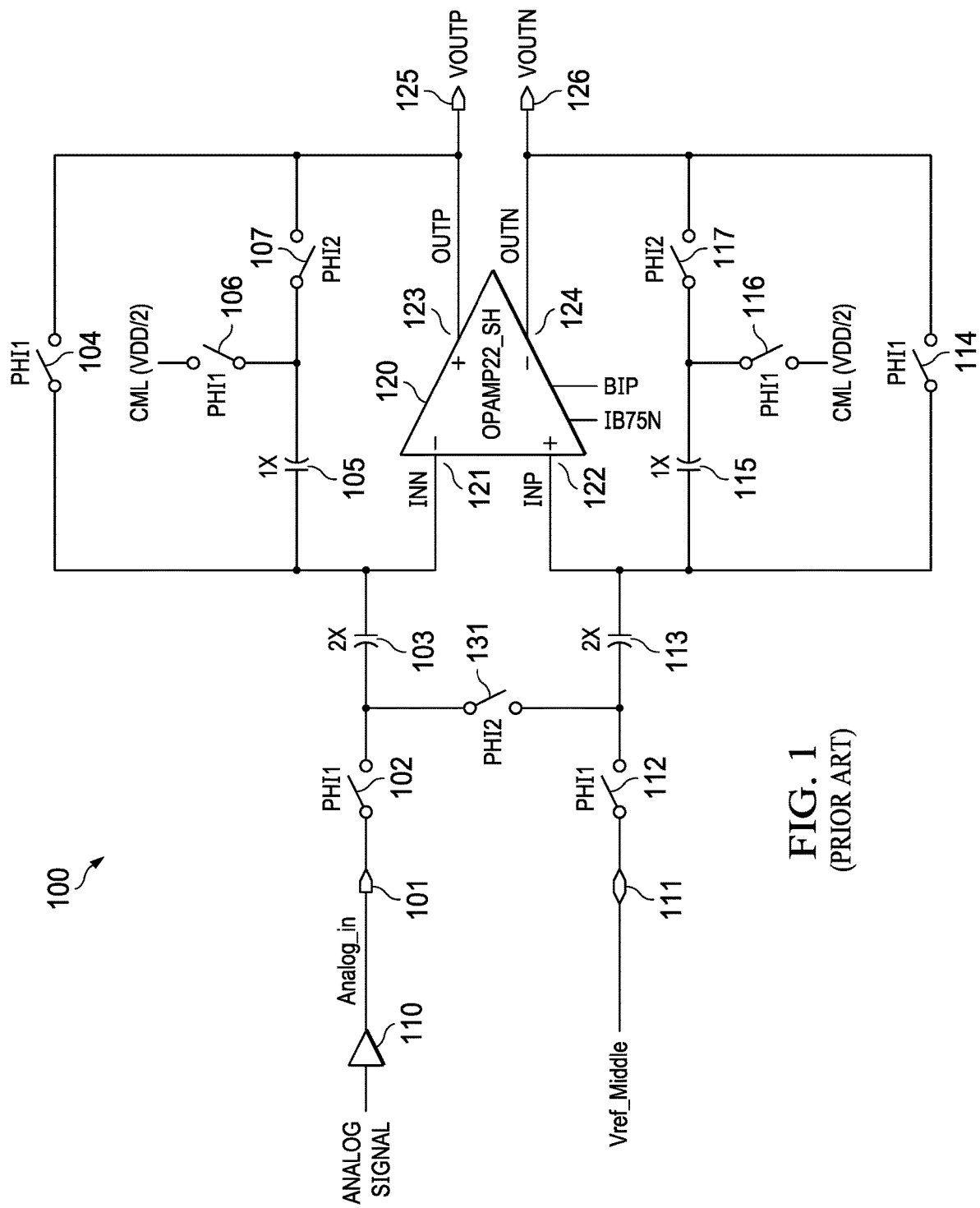
FIG. 1 is a schematic of a prior art sample and hold circuit.

In the drawings, like elements are denoted by like reference numerals for consistency.

A typical sample and hold circuit stores electric charge in a capacitor and contains at least one switching device, such as a FET (field effect transistor), and an operational amplifier (op-amp). To sample an input signal, the FET switch connects the capacitor, referred to herein as the "sample capacitor," to a signal to be measured, such as the output of a buffer amplifier. The buffer amplifier charges or discharges the capacitor so that the voltage across the hold capacitor is practically equal, or proportional to, the input signal voltage. In hold mode, the switch disconnects the sample capacitor from the buffer. The sample capacitor tends to be discharged by its own leakage currents and load currents from the op-amp input, which makes the circuit inherently volatile. Typically, the voltage drop within a specified hold typically time remains within an acceptable error margin.

When the sample and hold circuit switches from sample to hold, there is generally a small amount of charge dumped on the hold capacitor because of non-ideal switches. This results in a hold mode dc offset voltage which is called pedestal error. If the sample and hold circuit is driving an ADC, the pedestal error appears as a dc (direct current) offset voltage which may be removed by performing a system calibration. If the pedestal error is a function of input signal level, the resulting nonlinearity contributes to hold mode distortion. Pedestal errors may be reduced by increasing the value of the hold capacitor with a corresponding increase in acquisition time and a reduction in bandwidth and slew rate.

An example sample and hold circuit uses a unity gain op-amp with differential outputs to allow simple offset cancellation. In a typical differential sample and hold circuit, the input bandwidth is usually limited by the bandwidth of the op-amp when put in unity gain. The effective input resistance (Rin) is 1/gm (trans-conductance) of the op-amp.

An improved configuration will be described herein below that eliminates the bandwidth dependency on the op-amp by adding a complementary metal oxide semiconductor (CMOS) switch that is coupled to the sampling capacitor. This CMOS switch is tied to the inverting input of the op-amp connecting it to a fixed reference voltage, such as a common input voltage that is one half the supply voltage (VDD/2). This switch will provide a low impedance path from the reference voltage to the sampling capacitor if the width/length (W/L) is sized large enough and thereby provide high bandwidth operation of the sample and hold circuit irrespective of the op-amp gm.

FIG. 1 is a schematic of a typical sample and hold circuit 100 such as that of a CMOS ADC. CMOS ADCs are popular because of their low power and low cost. The equivalent input circuit of a typical CMOS ADC using a differential sample-and-hold is shown in FIG. 1. In this example, an analog signal is received by buffer amplifier 110. The output of buffer amplifier 110 is provided to input terminal 101. A steady reference voltage is provided to input terminal 111. CMOS switch 102 periodically connects the input signal on input terminal 101 to sample capacitor 103, which is connected to negative input terminal 121 of op-amp 120. Feedback switch 104 periodically connects output 123 of op-amp 120 to input 121. Hold capacitor 105 is connected in series with feedback switch 107 that is also connected to op-amp output 123. Switch 106 is connected to hold capacitor 105 and periodically connects to steady reference voltage CML (Common mode level), which in many op-amp designs is equal to VDD/2. However, in some examples CML may be higher or lower than VDD/2.

Similarly, CMOS switch 112 periodically connects a Vref_Middle reference voltage on input terminal 111 to sample capacitor 113, which is connected to positive input terminal 122 of op-amp 120. Vref_Middle is approximately VDD/2, as described in more detail herein below. Feedback switch 114 periodically connects negative output 124 of op-amp 120 to input 122. Hold capacitor 115 is connected in series with feedback switch 117 that is also connected to op-amp negative output 124. Switch 116 is connected to hold capacitor 115 and periodically connects to steady reference voltage CML, which in many op-amp designs is equal to VDD/2.

The switches open/close at the sampling frequency under the control of clock signals PH1 and PH2. Clock signals PH1, PH2 are square wave signals that are out of phase with each other. PH1 is the sampling phase and PH2 is the hold phase. In the sample mode, the input voltage present on input terminal 101 and the reference voltage present on input terminal 111 are applied to the sample capacitors 103, 113 respectively. Simultaneously, hold capacitors 105, 115 are preset by switches 106, 116 respectively connecting to the CML reference voltage. When the circuit enters the hold mode, the voltage across the sampling capacitors is transferred to the hold capacitors 105, 115 by opening switches 104, 106, 114, and 116 and closing switches 107, 117 and 131. Unity gain op-amp 120 maintains the voltage across hold capacitors 105, 115, respectively. When the sample and hold circuit returns to the sample mode, the input source must charge or discharge the voltage stored on sample capacitor 103 to a new input voltage.

The maximum sampling bandwidth is limited by the settling time of op-amp 120 due to the feedback path from op-amp output 123 through switch 104 to op-amp input 121 and sample capacitor 103.

Figure 2:
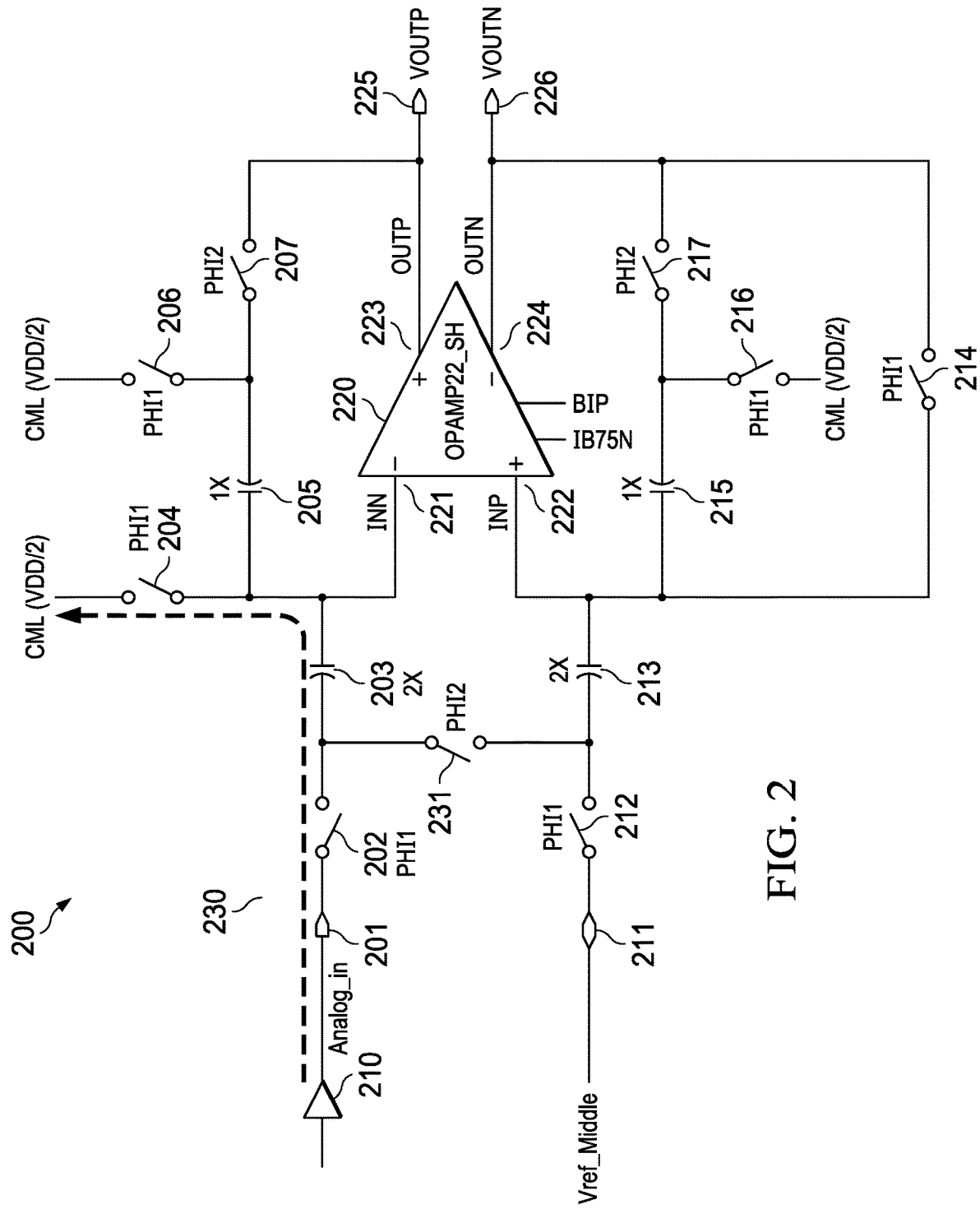
FIG. 2 is a schematic of an example sample and hold circuit with CMOS switches in the sample path.

FIG. 2 is a schematic of an example sample and hold (SH) circuit 200 with CMOS switches 202 and 204 in the sample path 230. This circuit is similar to sample and hold circuit 100 (FIG. 1) except CMOS switch 204 is connected to the CML reference voltage instead of an output terminal of op-amp 220. In this manner, the input sampling bandwidth is determined by the speed of CMOS switches 202, 204.

Offset is also cancelled by this configuration. Offset is large in deep submicron processes such as used in typical CMOS integrated circuits. In this example the offset is stored by connecting VOUTN from op-amp negative output 224 to INP on op-amp positive input 222 while VOUTP from op-amp positive output 223 is left unconnected during the sample phase. Because INM on op-amp input 221 is tied to CML (VDD/2) during the sampling phase, the offset is stored on the sampling capacitor 213 sampling a reference voltage on SH input terminal 211.

In this example, an analog signal is received by buffer amplifier 210. The output of buffer amplifier 210 is provided to SH input terminal 201. A steady reference voltage Vref_middle is provided to SH input terminal 211. CMOS switch 202 periodically connects the input signal on SH input terminal 201 to sample capacitor 203. The other terminal of sample capacitor 203 is connected to negative input terminal 221 of op-amp 220. Switch 204 periodically connects the CML reference voltage to negative input 221. Hold capacitor 205 is connected in series with feedback switch 207 that is also connected to op-amp positive output 223. Switch 206 is connected to hold capacitor 205 and periodically couples steady reference voltage CML, which is equal to VDD/2, to hold capacitor 205.

Similarly, CMOS switch 212 periodically connects the reference voltage on input terminal 211 to sample capacitor 213, which is connected to positive input terminal 222 of op-amp 220. Feedback switch 214 periodically connects negative output 224 of op-amp 220 to positive input 222. Hold capacitor 215 is connected in series with feedback switch 217 that is also connected to op-amp negative output 224. Switch 216 is connected to hold capacitor 215 and periodically couples hold capacitor 215 to steady reference voltage CML, which is equal to VDD/2.

The switches open/close at a sampling frequency under the control of clock signals PH1 and PH2. Clock signals PH1, PH2 are non-overlapping square wave signals that are out of phase with each other. PH1 is the sampling phase and PH2 is the hold phase. In this example, the switches 202, 212, 204, 214, 206, 216 controlled by clock signal PH1 are closed while signal PH1 is active and open while signal PH1 is not active. Similarly, the switches 231, 207, 217 controlled by PH2 are closed while signal PH2 is active and open while signal PH2 is not active. As will be explained in more detail with reference to FIG. 4, each of the CMOS switches are implemented with two back to back FETs that are controlled by a positive and an inverted version respectively of the clock signal PH1 or PH2. The term "active" refers to the period of time of a square wave signal during which the clock signal is set to a voltage level that corresponds to a "high" logic level, while the term "not active" refers to the period of time of the square wave signal during which the clock signal is set to a voltage level that corresponds to a "low" logic level In the sample mode, the input voltage present on input terminal 201 and the reference voltage present on input terminal 211 are applied to the sample capacitors 203, 213 respectively. Simultaneously, hold capacitors 205, 215 are preset by switches 206, 216 respectively that are connecting to the CML reference voltage. When the circuit enters the hold mode, the voltage across the sampling capacitors is transferred to the hold capacitors 205, 215 by opening switches 204, 206, 214, and 216 and closing switches 207, 217 and 231. Unity gain op-amp 220 maintains the voltage across hold capacitors 205, 215, respectively. When the sample and hold circuit returns to the sample mode, the input source must charge or discharge the voltage stored on sample capacitor 203 to a new input voltage. This action of charging and discharging sampling capacitor 203, averaged over a period of time and for a given sampling frequency fs, makes the input impedance appear to have a primarily resistive component.

The resistive component to the input impedance can be computed by calculating the average charge that is drawn by hold capacitor 205 from the input drive source buffer amp 210. It can be shown that if sample capacitor 203 is allowed to fully charge to the input voltage before switches 202, 212 are opened that the average current into the input is the same as if there were a resistor equal to $1/(Cs*fs)$ connected between the inputs, where Cs is the capacitance of sample capacitor 203. In this example, Cs is 4 picofarads. Since CS is only a few picofarads, this resistive component is typically greater than several k$\Omega$ for an fs=10 MSPS (mega samples per second), for example.

Figure 3:
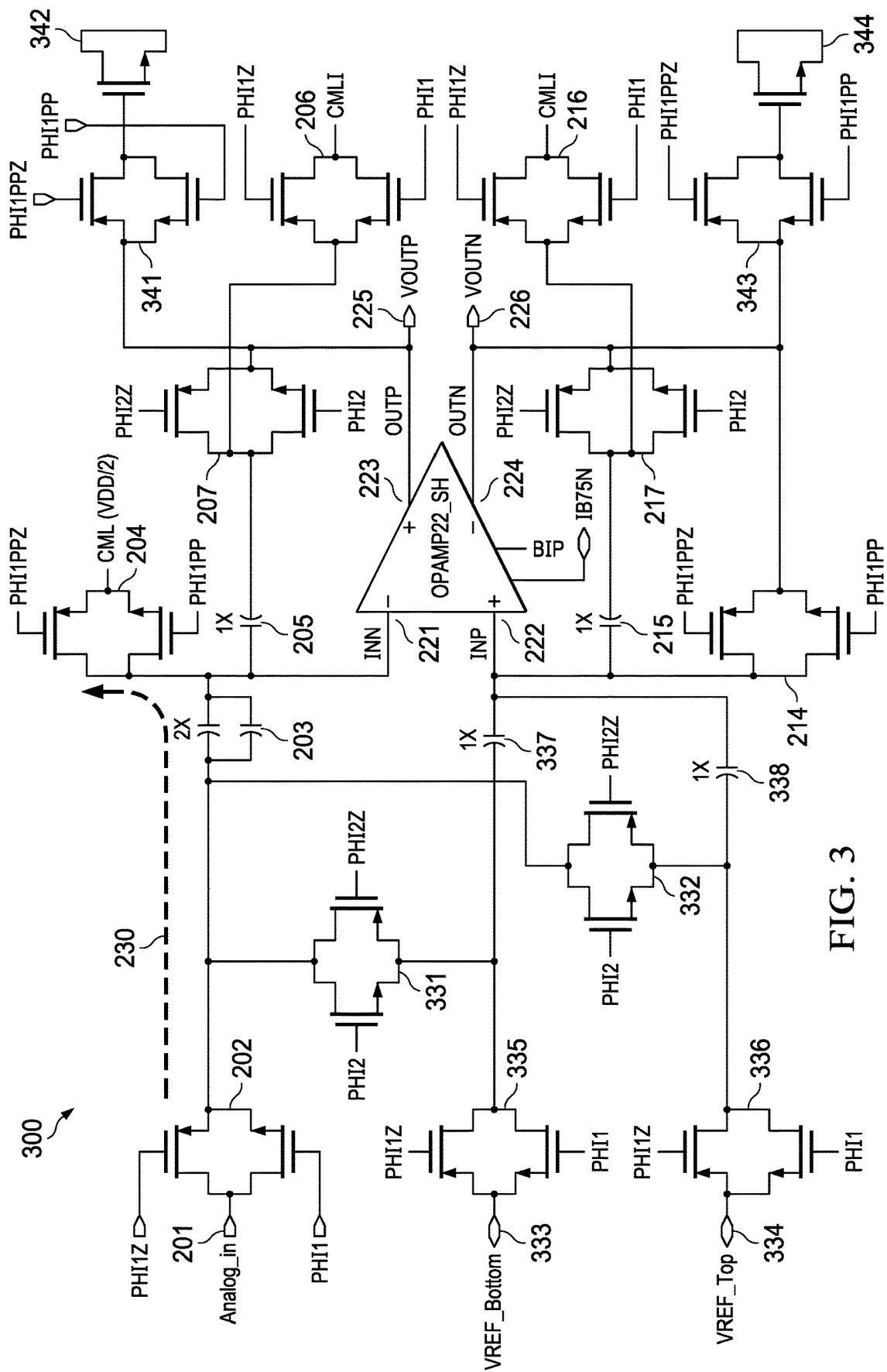
FIG. 3 is a schematic of another example sample and hold circuit with CMOS switches in the sample path with a split sampling capacitor.

FIG. 3 is a schematic of another example sample and hold circuit 300 with CMOS switches 202, 204 in the sample path 230 with a split sampling capacitor 337, 338 in place of sampling capacitor 213 in FIG. 2. This circuit operates in a similar manner to sample and hold circuit 200 (FIG. 2).

In this example, a sampling capacitance (similar to sampling capacitor 213 of FIG. 2) is provided by two capacitors 337, 338 supplied by Vref_Top 334 and Vref_Bottom 333 inputs instead of Vref_Middle 211 (FIG. 2), which is a reference voltage that is approximately midway between Vref_Top 334 and Vref_Bottom 333, (Vref_Top+Vref_Bottom)/2. If Vref_Middle is available, then a single sampling capacitor 213 (FIG. 2) can be used.

The voltage values of Vref_Top and Vref_Bottom are selected for a particular application and may represent the top (Vref top) and bottom (Vref bottom) of the input range of an analog signal input. In an example, the op-amp VDDA supply is 1.8 V, the Vref_Top is about 1.6 V and Vref bottom is about 0.2 V. Therefore, the analog signal input range is 1.4 V. Vref_Middle is (Vref top+Vref bottom)/2=0.9 V. This is also the same as the CML (VDD/2) voltage level. The Analog_in range is between 0.2 V and 1.6 V.

In this example, the implementation of the various CMOS switches is shown in more detail. Each CMOS switch is implemented with back to back PMOS and NMOS devices that are controlled by a clock signal and an inverted clock signal, respectively, such as PHI1, PHI1Z and PHI2, PHI2Z. In this example, switches 204 and 214 are controlled by pre-phase clock signals PHI1PP, PHI1PPZ, which are shifted slightly in time from PHI1, PHI1Z by a small delta, such as 0.1 ns, to minimize switching overlap.

In this example, VSS switch 341 couples op-amp output 223 to a gate of NMOS transistor 342 when switched on in response to clock signal PHIPP, PHIPPZ. Similarly, VSS switch 343 couples op-amp output 224 to a gate of NMOS transistor 344 when switched on in response to clock signal PHI1PP, PHI1PPZ. VSS is ground; the source and drain of NMOS transistors 342, 344 are connected to VSS and thereby NMOS transistors 342, 344 are configured as capacitors to ground. Some op-amps, depending on architecture, require capacitors at the outputs when placed in unity gain closed loop feedback to be stable.

Nyquist sampling requires the input frequency to be under CK rate (Sample rate) divided by two to reconstruct the signal without aliasing. For example, if the sampling rate is 500 MHz, then the input frequency must be less than 250 MHz to meet the Nyquist criteria. However, there are cases where the input signal frequency may higher than the clock or sample rate divided by two; these cases are referred to as "under sampling." When the input is a sine wave, the input frequency can be much higher than the sampling rate and there will be no aliasing since the FFT of a sine is a pulse function. The example SH circuits 200, 300 work well with sine wave inputs to allow under sampling of input signals that have a much higher frequency than the sampling rate. Offset of the op-amp is cancelled without any special timing restrictions.

In some example implementations of the sample and hold circuits of FIGS. 2-3 an analog bandwidth in the range of at least 2-5 GHz is provided using a sampling rate of approximately 500 MHz for sampling signals PHI1/PHI2. In other example implementations using devices with a faster switching rate, the operating analog bandwidth may be larger than 2-5 GHz.

Figure 4A:
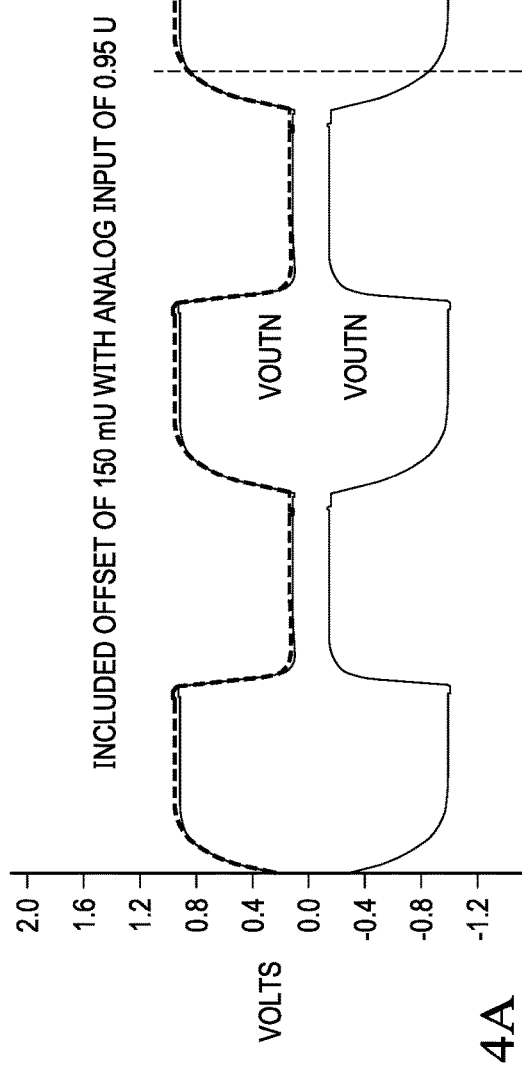
FIGS. 4A and 4B are plots of simulated operation of the sample and hold circuit of FIG. 2.
Figure 4B:
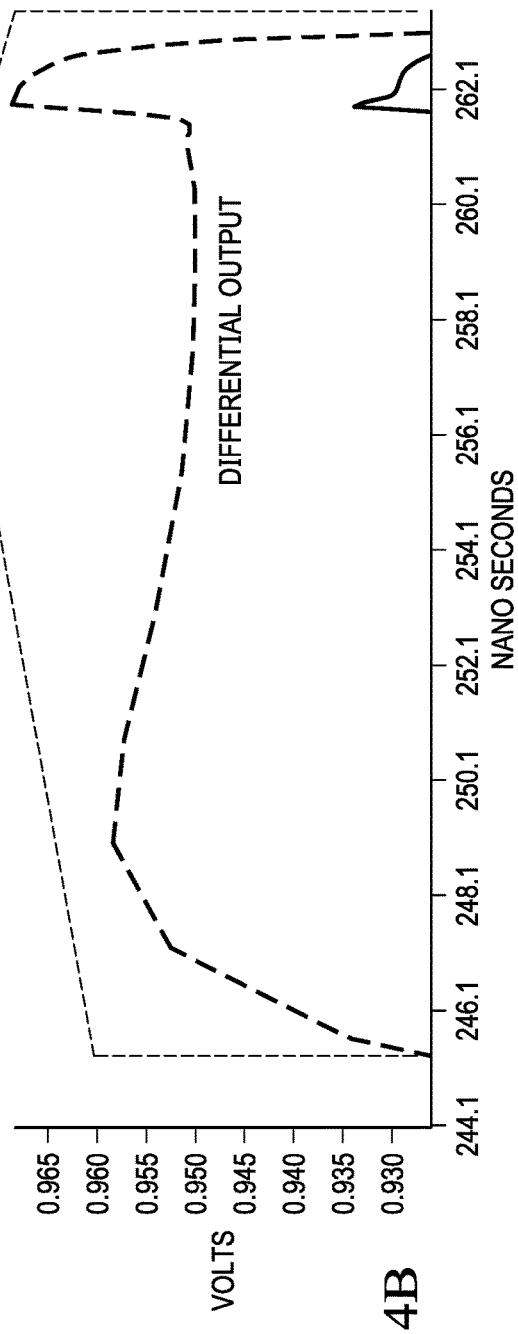

FIGS. 4A, 4B are plots of volts vs time in nanoseconds of simulated operation of the sample and hold circuit 200 of FIG. 2 with an induced op-amp offset of 150 mV and an Analog Input of 0.95 V. FIG. 4A illustrates output signals VOUTP, VOUTN that appear on output terminals 225, 226 respectively which clearly show the offset voltage being sampled when PHI1 phase is active. FIG. 4B is an expanded view of one phase of operation and shows the differential output settling perfectly to the input sampled value of 0.95 V. FIG. 4A and FIG. 4B demonstrate how well offset is cancelled by the SH circuit 200 of FIG. 2.

Figure 5:
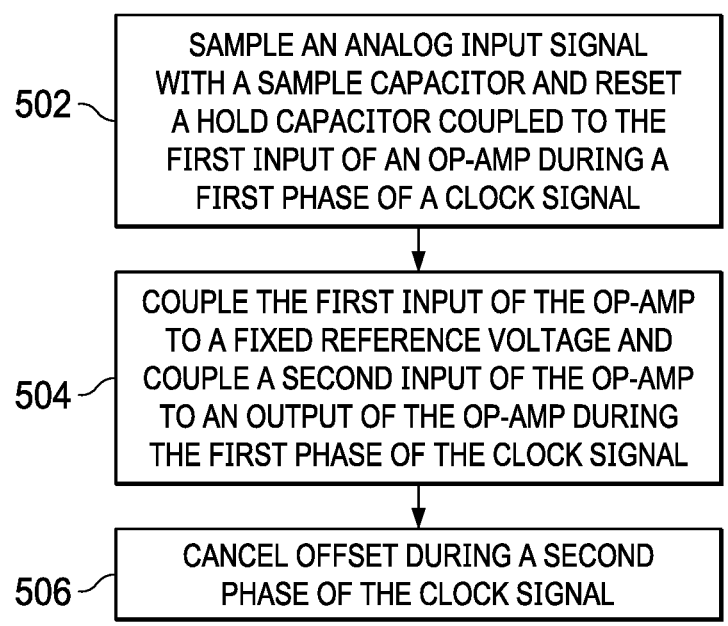
FIG. 5 is a flow diagram of operation of an example sample and hold circuit.

FIG. 5 is a flow diagram of operation of an example sample and hold circuit, such as sample and hold circuit 200 of FIG. 2 and/or sample and hold circuit 300 of FIG. 3. As described herein regarding FIGS. 2, 3, described examples of a sample and hold circuit include a differential op-amp that has two complimentary inputs and two complementary outputs. The op-amp is configured to operate at unity gain by feedback paths that couple the outputs to respective inputs.

At 502, an analog input signal is sampled by coupling it to one side of a sampling capacitor during a first phase of a clock period. An opposite side of the sampling capacitor is connected to a first input of the op-amp. A hold capacitor in the feedback path with one side coupled to the first input of the op-amp is reset by coupling an opposite side of the hold capacitor to a fixed reference voltage during a first phase of a clock period.

During the same phase, a reference signal is sampled by coupling it to one side of another sampling capacitor during a first phase of a clock period. An opposite side of this sampling capacitor is connected to a second input of the op-amp. A hold capacitor in the feedback path with one side coupled to the second input of the op-amp is reset by coupling an opposite side of the hold capacitor to a fixed reference voltage during the first phase of the clock period.

At 504, the first input of the op-amp is also coupled to the fixed reference voltage and a second input of the op-amp is coupled to an inverted output of the op-amp during the first phase of the clock period.

At 506, offset is cancelled by isolating the sampling capacitors and the hold capacitors from the analog inputs and the fixed reference voltage during a second phase of the clock period. During the second phase of the clock period, the hold capacitors are coupled to respective outputs of the op-amp and the sampling capacitors are coupled together.

System Example

Figure 6:
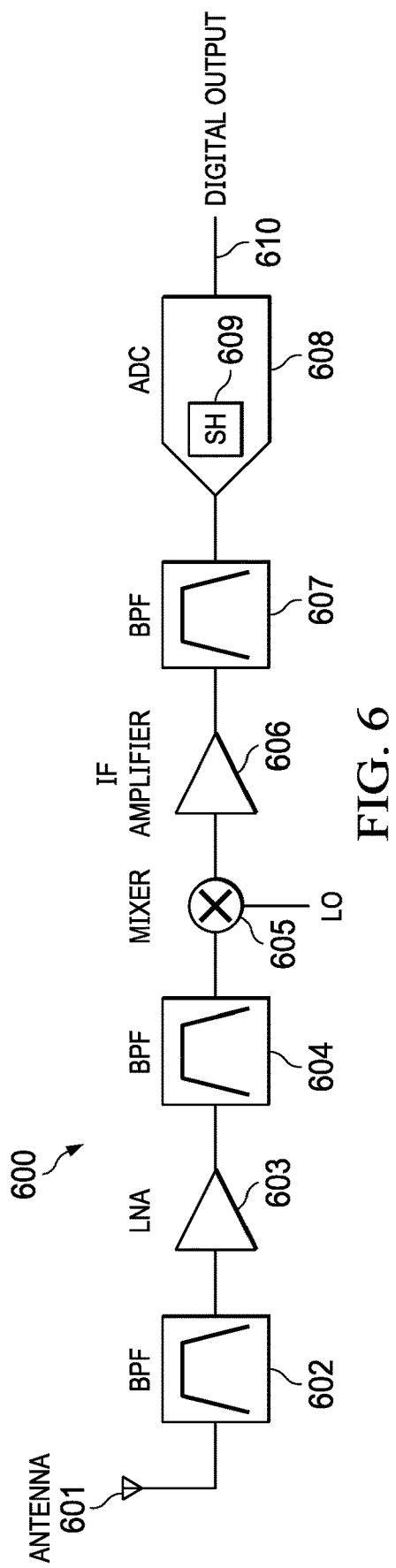
FIGS. 6 and 7 are block diagrams of an example system for receiving radio frequency signals.

FIG. 6 is a block diagram of an example system 600 that functions as a radio frequency (RF) receiver. The general concept of RF receivers is well known and need not be described in detail herein. In this example, an RF signal is received by an antenna 601 and provided to a bandpass filter (BPF) 602. A low noise amplifier (LNA) 603 amplifies the filtered output of BPF 602. Another BPF 604 further filters the amplified signal from LNA 603. Mixer 605 combines the output signal from BPF 604 with a lower frequency signal to produce an intermediate frequency (IF) signal that is amplified by IF amplifier 606 and then filtered by BPF 607. An analog to digital converter (ADC) 608 that includes a sample and hold circuit 609 then converts the output of BPF 607 to form digital output 610. Sample and hold circuit 609 is capable of operating at intermediate radio frequencies using the high frequency sampling technique as described herein above in FIGS. 2-4.

Figure 7:
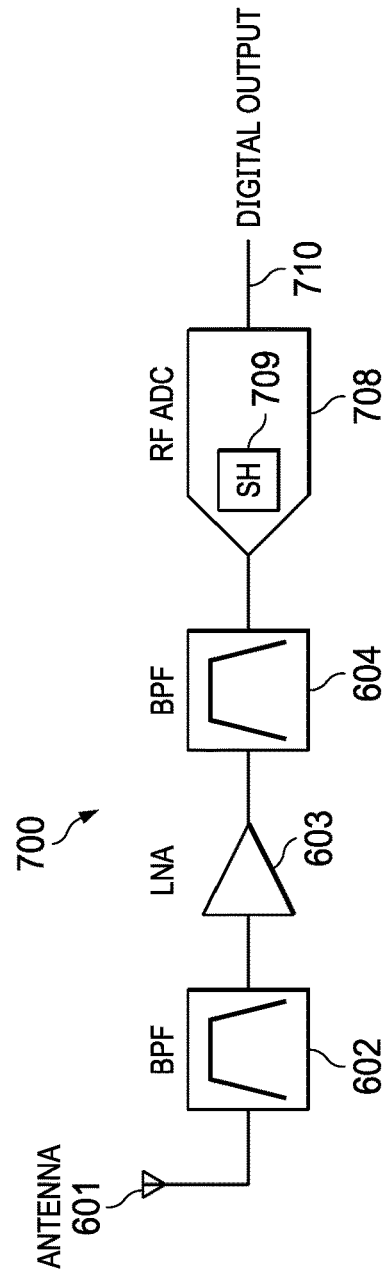

FIG. 7 is a block diagram of an example system 700 that functions as a radio frequency (RF) receiver and includes a radio frequency sample and hold circuit 709. In this example, an RF signal is received on antenna 601, bandpass filtered by BPF 602, amplified by LNA 603, bandpass filtered by BPA 604 in a similar manner to system 600 (FIG. 6). RF ADC 708 includes a sample and hold circuit 709 that is capable of operating at radio frequencies using the high frequency sampling technique as described herein above in FIGS. 2-4.

Since RF ADC 708 is capable of sampling RF frequencies, thanks to high bandwidth SH circuit 709, radio frequency receiver system 700 may use the RF ADC 708 to digitize the signal without an intervening intermediate frequency mixer 605, IF amplifier 606, and BPF 607 used in system 600 in FIG. 6.

OTHER EMBODIMENTS

In described examples, the analog signal sampling capacitor is shown coupled to an inverting input of the op-amp with a feedback loop coupled to a non-inverting output of the op-amp. The reference signal sampling capacitor is shown coupled to a non-inverting input amp with a feedback loop coupled to an inverting output of the op-amp. In another example, the op-amp may be "flipped" such that the analog signal sampling capacitor is coupled to a non-inverting input of the op-amp with a feedback loop coupled to an inverting output of the op-amp while the reference signal sampling capacitor is coupled to an inverting input amp with a feedback loop coupled to a non-inverting output of the op-amp.

Described examples refer to the op-amp inputs and outputs as "inverting" and "non-inverting." In other examples, similar terms may be used to mean the same thing, such as "positive" and "negative,"

In a described example, input buffer 210 (FIG. 2) is illustrated. In another example, an input buffer may not be needed or may be provided elsewhere.

In described examples, CMOS switches are illustrated. In another example, another type of known or later developed semiconductor switches that can be controlled by clock signals may be used to couple and decouple the sample and hold capacitors as described hereinabove.

The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

Modifications are possible in the described embodiments, and other embodiments are possible, within the scope of the claims.

What is claimed is:

1. A circuit comprising:
an input terminal;
a first switch coupled to the input terminal;
a first sampling capacitor having a first terminal coupled to the first switch and a second terminal;
a differential op-amp having a first input coupled to the second terminal of the first sampling capacitor, a second input, a first output, and a second output;
a first reference voltage terminal;
a second switch coupled between the first input of the differential op-amp and the first reference voltage terminal; and
a first phase signal line coupled to switch the first switch and the second switch.

2. The circuit of claim 1, further comprising:
a first hold capacitor having a first terminal coupled to the first input of the differential op-amp and a second terminal;
a third switch coupled between the second terminal of the first hold capacitor and the first reference voltage terminal; and
a fourth switch coupled between the second terminal of the first hold capacitor and the first output of the differential op-amp.

3. The circuit of claim 2, further comprising:
a second hold capacitor having a first terminal coupled to the second input of the differential op-amp and a second terminal;
a fifth switch coupled between the second output of the differential op-amp and the second terminal of the second hold capacitor; and a sixth switch coupled between the first reference voltage terminal and the second terminal of the second hold capacitor.

4. The circuit of claim 3, further comprising:
a seventh switch coupled between the second output of the differential op-amp and the second input of the differential op-amp.

5. The circuit of claim 4, further comprising:
a second reference voltage terminal;
a second sampling capacitor having a first terminal and a second terminal coupled to the second input of the differential op-amp; and
an eighth switch coupled between the second reference voltage terminal and the first terminal of the second sampling capacitor.

6. The circuit of claim 5, further comprising:
a ninth switch coupled between the first terminal of the second sampling capacitor and the first terminal of the first sampling capacitor.

7. A circuit comprising:
an input terminal;
a first switch coupled to the input terminal;
a first sampling capacitor having a first terminal coupled to the first switch and a second terminal;
a differential op-amp having a first input coupled to the second terminal of the first sampling capacitor, a second input, a first output, and a second output;
a first reference voltage terminal;
a second switch coupled between the first input of the differential op-amp and the first reference voltage terminal;
a second reference voltage terminal;
a second sampling capacitor having a first terminal and a second terminal coupled to the second input of the differential op-amp; and
a third switch coupled between the second reference voltage terminal and the first terminal of the second sampling capacitor;
a third reference voltage terminal;
a third sampling capacitor having a first terminal and a second terminal coupled to the second input of the differential op-amp; and
a fourth switch coupled between the third reference voltage terminal and the first terminal of the third sampling capacitor.

8. The circuit of claim 7, further comprising:
a fifth switch coupled between the first terminal of the third sampling capacitor and the first terminal of the first sampling capacitor.

9. The circuit of claim 1, wherein:
the first input of the differential op-amp is a negative input, the second input of the differential op-amp is a positive input, the first output of the differential op-amp is a positive output, and the second output of the differential op-amp is a negative output.

10. The circuit of claim 1, wherein:
the first switch and the second switch are complementary metal oxide semiconductor (CMOS) switches.

11. The circuit of claim 10, wherein:
each of the CMOS switches are back to back p-channel metal oxide semiconductor (PMOS) and n-channel metal oxide semiconductor (NMOS) devices.

12. A method comprising:
receiving an input signal on a first capacitor coupled to a first input of an op-amp;
decoupling a hold capacitor from a first output of the op-amp;

coupling the hold capacitor to a reference voltage;
coupling the first input of the op-amp to the reference voltage;
coupling a second input of the op-amp to a second output of the op-amp;
isolating the first capacitor and the hold capacitor from the input signal and the reference voltage; and
coupling the hold capacitor to the first output of the op-amp.

13. The method of claim 12, wherein the steps of receiving an input signal on the first capacitor, decoupling the hold capacitor from the first output of the op-amp, coupling the hold capacitor to the reference voltage, coupling the first input of the op-amp to the reference voltage; and coupling the second input of the op-amp to the second output of the op-amp are performed during a first phase of a clock signal.

14. The method of claim 13, wherein the steps of isolating the first capacitor and the hold capacitor from the input signal and the reference voltage, and coupling the hold capacitor to the first output of the op-amp are performed during a second phase of the clock signal.

15. The method of claim 14, wherein the first capacitor, the hold capacitor, and the op-amp are part of a sample and hold circuit, the method further comprising, during the first phase of the clock signal, storing in a second capacitor an offset voltage associated with the sample and hold circuit, the second capacitor being coupled to the second input of the op-amp.

16. The circuit of claim 1, further comprising:
a second reference voltage terminal; and
a third switch coupled between the first input of the differential op-amp and the second reference voltage terminal, wherein the first phase signal line is further coupled to switch the third switch.

17. The circuit of claim 16, further comprising:
a first hold capacitor coupled between the first input of the differential op-amp and the first output of the differential op-amp; and
a fourth switch coupled between the first hold capacitor and the second reference voltage terminal, wherein the first phase signal line is further coupled to switch the fourth switch.

18. The circuit of claim 16, further comprising:
a fourth switch coupled between the first input of the differential op-amp and the first output of the differential op-amp; and
a fifth switch coupled between the second output of the differential op-amp and the second input of the differential op-amp; and
a second phase signal line coupled to switch the fourth switch, wherein the first phase signal line is further coupled to switch the fifth switch, and wherein the first and second phase signal lines are configured to carry non-overlapping first and second signals, respectively.

19. The circuit of claim 1, wherein the input terminal, the first and second switches, the first sampling capacitor, the differential op-amp, the first reference voltage terminal, and the first phase signal line are part of a sample and hold circuit that is part of an analog-to-digital converter (ADC).

20. The circuit of claim 7, wherein the first, second, third, and fourth switches are complementary metal oxide semiconductor (CMOS) switches, and wherein each of the CMOS switches include back to back p-channel metal oxide semiconductor (PMOS) and n-channel metal oxide semiconductor (NMOS) devices.

* * * * *